United States Patent
Gu et al.

(10) Patent No.: US 11,387,349 B2
(45) Date of Patent: Jul. 12, 2022

(54) TRENCH GATE DEPLETION MODE VDMOS DEVICE AND METHOD FOR MANUFACTURING THE SAME

(71) Applicant: CSMC TECHNOLOGIES FAB2 CO., LTD., Wuxi (CN)

(72) Inventors: Yan Gu, Wuxi (CN); Shikang Cheng, Wuxi (CN); Sen Zhang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 3 days.

(21) Appl. No.: 17/265,587

(22) PCT Filed: Oct. 14, 2019

(86) PCT No.: PCT/CN2019/111016
§ 371 (c)(1),
(2) Date: Feb. 3, 2021

(87) PCT Pub. No.: WO2020/078315
PCT Pub. Date: Apr. 23, 2020

(65) Prior Publication Data
US 2021/0167191 A1     Jun. 3, 2021

(30) Foreign Application Priority Data
Oct. 15, 2018   (CN) .......................... 201811195273.0

(51) Int. Cl.
*H01L 29/66*   (2006.01)
*H01L 29/78*   (2006.01)

(52) U.S. Cl.
CPC .... *H01L 29/66734* (2013.01); *H01L 29/7813* (2013.01)

(58) Field of Classification Search
CPC ...................... H01L 29/66734; H01L 29/7813
(Continued)

(56) References Cited

U.S. PATENT DOCUMENTS 6,194,741 B1    2/2001  Kinzer et al.
6,639,260 B2   10/2003  Suzuki et al.
(Continued)

FOREIGN PATENT DOCUMENTS

| CN | 203521427 U | * | 4/2014 |
| CN | 203521427 U |   | 4/2014 |
| CN | 105448733 A |   | 3/2016 |

OTHER PUBLICATIONS

International Search Report for PCT/CN2019/111016, dated Jan. 8, 2020, 2 pages.

*Primary Examiner* — Igwe U Anya
(74) *Attorney, Agent, or Firm* — Dority & Manning, P.A.

(57) ABSTRACT

A trench gate depletion-type VDMOS device and a method for manufacturing the same are disclosed. The device comprises a drain region; a trench gate including a gate insulating layer on an inner wall of a trench and a gate electrode filled in the trench and surrounded by the gate insulating layer; a channel region located around the gate insulating layer; a well region located on both sides of the trench gate; a source regions located within the well region; a drift region located between the well region and the drain region; a second conductive-type doped region located between the channel region and the drain region; and a first conductive-type doped region located on both sides of the second conductive-type doped region and located between the drift region and the drain region.

15 Claims, 4 Drawing Sheets

(58) Field of Classification Search
USPC .......................................................... 257/288
See application file for complete search history.

(56) References Cited

U.S. PATENT DOCUMENTS

| | | |
|---|---|---|
| 7,994,513 B2 | 8/2011 | Yamamoto et al. |
| 9,093,522 B1 | 7/2015 | Zeng et al. |
| 9,318,600 B2 * | 4/2016 | Kudou .............. H01L 29/66734 |
| 10,622,446 B2 | 4/2020 | Kobayashi et al. |
| 2009/0261350 A1 * | 10/2009 | Yamamoto .......... H01L 29/7397 |
| | | 257/77 |

* cited by examiner

TRENCH GATE DEPLETION MODE VDMOS DEVICE AND METHOD FOR MANUFACTURING THE SAME

CROSS REFERENCE TO RELATED APPLICATIONS

This application is a National Stage application of PCT international application PCT/CN2019/111016, filed on Oct. 14, 2019 which claims priority to Chinese patent application No. 2018111952730, entitled "Trench gate depletion mode VDMOS device and method for manufacturing the same", filed before the China National Intellectual Property Administration on Oct. 15, 2018, both of which are incorporated herein by reference in their entireties.

TECHNICAL FIELD

The invention relates to the field of semiconductor manufacturing, and in particular, to a trench gate depletion mode VDMOS device and a method for manufacturing the trench gate depletion mode VDMOS device.

BACKGROUND

In many circuits and systems, a depletion mode VDMOS (vertical double diffused metal oxide semiconductor field effect transistor) device is commonly used with a enhancement mode VDMOS device. A depletion mode VDMOS usually operates during a start-up stage of a circuit. When the circuit has been started and transitioned to its stable operating state, a conductive channel of the depletion mode VDMOS is pinched off to cut off this device, thereby enabling the circuit to operate normally. A longitudinal channel of such a trench gate depletion mode VDMOS can be easily depleted and pinched off, and the pinch-off current is stable. Due to these advantages, such a trench gate depletion mode VDMOS has been widely used in medium and small power circuits and systems.

During the start-up stage of the circuit, a large start-up current would pass through the depletion mode VDMOS, which is often higher than the current of the circuit at the stable operating state. Therefore, a key point in design of a depletion mode device is to increase the operating current of the depletion mode device at an ON-state. Low on-resistance has become an important design index for a depletion mode VDMOS, and this is also true for a trench gate depletion mode VDMOS.

SUMMARY

In view of this, it is necessary to provide a trench gate depletion mode VDMOS device with a low on-resistance and a method for manufacturing the same.

A trench gate depletion mode VDMOS device comprises: a drain region being of a first conductive type; a trench gate including a gate insulating layer on an inner wall of a trench and a gate electrode filled in the trench and surrounded by the gate insulating layer; a channel region located around the gate insulating layer and being of the first conductive type; a well region located on both sides of the trench gate and being of a second conductive type, the first conductive type is a conductive type opposite to the second conductive type; a source region located in the well region and being of the first conductive type; a drift region located between the well region and the drain region and being of the first conductive type; a second conductive type doped region located between the channel region and the drain region; a first conductive type doped region located on both sides of the second conductive type doped region and located between the drift region and the drain region.

A method for manufacturing a trench gate depletion mode VDMOS device comprises: providing a substrate, the substrate includes a first conductive type doped region and a drift region of a first conductive type on the first conductive type doped region; forming a trench by etching the drift region; doping on the side walls of the trench and forming a channel region in the trench; doping impurities of a second conductive type into an area of the first conductive type doped region around the bottom of the trench, such that a second conductive type doped region is formed within the first conductive type doped region; the first conductive type is an conductive type opposite to the second conductive type; forming a gate insulating layer on the inner wall of the trench; forming a gate electrode by filling the remaining space in the trench; doping impurities of the second conductive type on the surface of the drift region and forming a well region on both sides of the trench; doping impurities of the first conductive type into the well region, such that a source region is formed.

The details of one or more embodiments of the invention are set forth in the accompanying drawings and the description below. Other features, objects, and advantages of the invention will become apparent from the description and drawings, and from the claims.

BRIEF DESCRIPTION OF THE DRAWINGS

In order to better describe and explain those embodiments and/or examples of the invention disclosed herein, reference may be made to one or more of the drawings. The additional details or examples used to describe the drawings should not be considered as a limitation on the scope of any of the disclosed invention, the embodiments and/or examples currently described, and the best modes of the invention as currently understood.

DETAILED DESCRIPTION OF THE EMBODIMENTS

As used herein, the terms from the semiconductor field are technology terms commonly used by the persons skilled in the art. For example, for P type and N type impurities, in order to distinguish the doping concentrations, simply P+ type is used to represent a P type impurity with a heavy doping concentration, P type is used to represent a P type impurity with a medium doping concentration, P− type is used to represent a P type impurity with a light doping concentration, N+ type is used to represent an N type impurity with a heavy doping concentration, N type is used to represent an N type impurity with a medium doping concentration, and N− type is used to represent an N type impurity with a light doping concentration.

Figure 1:
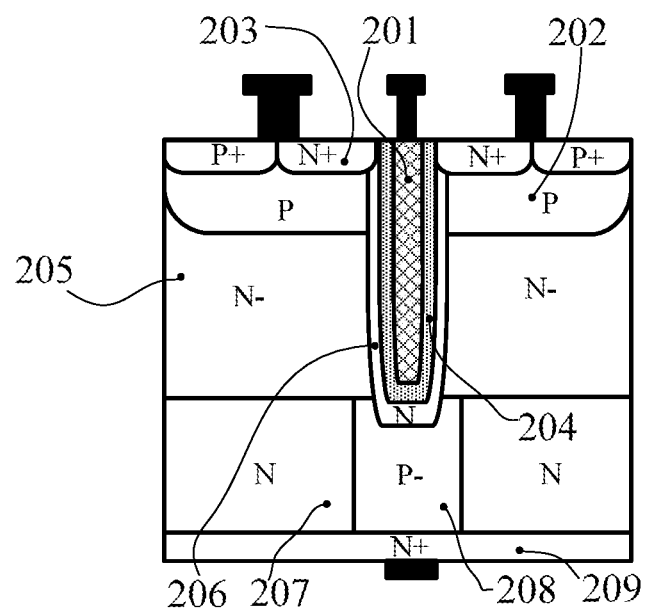
FIG. 1 is a schematic structure diagram of a trench gate depletion mode VDMOS device in an embodiment.

FIG. 1 is a schematic structure diagram of a trench gate depletion mode VDMOS device in an embodiment. The trench gate depletion mode VDMOS device includes a drain region 209, a trench gate (including a gate insulating layer 204 and a gate electrode 201), a channel region 206, a well region 202, a source region 203, a drift region 205, a second conductive type doped region 208 and a first conductive type doped region 207.

In the example, the drain region 209 is a drain region of a first conductive type, which is led out as a drain terminal of the VDMOS. In the present embodiment, the first conductive type is N type and the second conductive type is P type. The gate insulating layer 204 is arranged on an inner wall of a trench (which is the trench of the trench gate), and the gate electrode 201 is filled in the trench and is surrounded by the gate insulating layer 204. The channel region 206 is located around the gate insulating layer 204 and is a conductive channel of the first conductive type. Since the channel region is the channel of the depletion mode transistor, it is a normally-on channel. The well region 202 is located on both sides of the trench gate and is a well region of the second conductive type. The well region serves as a substrate of the depletion mode transistor, such that a longitudinal conductive channel is formed. The source region 203 is located within the well region 202 and is a source region of the first conductive type. The source region serves as an ohmic contact at a source terminal. The drift region 205 is located between the well region 202 and the drain region 209 and is a drift region of the first conductive type. The second conductive type doped region 208 is located between the channel region 206 and the drain region 209. In the present embodiment, the second conductive type doped region 208 is a P− well, and one end of the P− well is in contact with the channel region 206 and the other end is in contact with the drain region 209. The first conductive type doped region 207 is located on both sides of the second conductive type doped region 208, and is located between the drift region 205 and the drain region 209. In the present embodiment, the first conductive type doped region 207 is an N well.

For the trench gate depletion mode VDMOS device, a PN structure of the second conductive type doped region 208 and the first conductive type doped region 207 is formed at the bottom of the trench. In a ON-state of the depletion mode transistor, after the current has flown through the conductive channel into the PN structure, a charge balance is achieved between electrons and holes in this region. Compared with the drift region with a large resistance in traditional technology, the charge balance region has a lower resistance. Thus, the on-resistance of a single cell of the device in an ON-state is greatly reduced. As a result, more cells can be connected in parallel within a same chip area unit, thereby improving the ON-state current capability of the whole device.

In the embodiment shown in FIG. 1, the trench gate depletion mode VDMOS device also includes a body lead-out region of a second conductive type (i.e., a P+ region adjacent to the source region 203, not indicted in FIG. 1) in the well region 202. In the embodiment shown in FIG. 1, the second conductive type doped region 208 has a lower doping concentration than the well region 202, and the well region 202 has a lower doping concentration than the body lead-out region.

In the embodiment shown in FIG. 1, the well region 202 is a high-voltage P type well. The first conductive type doped region 207 and the second conductive type doped region 208 are a N type well and a P type well with a super junction structure, respectively.

In the embodiment shown in FIG. 1, the bottom of the channel region 206 extends into the second conductive type doped region 208. For a traditional trench gate depletion mode VDMOS transistor, there would be a weak point produced at the bottom of its trench when it is under a withstand voltage in an OFF-state. Specifically, because of a larger curvature at the bottom of the trench, a highest impact ionization rate is generally concentrated on a sharp corner at the bottom of the trench when the device is under a reverse withstand voltage, causing this position to break down easily. However, for the trench gate depletion mode VDMOS device shown in FIG. 1, the channel region 206 at the bottom of the trench is wrapped into the second conductive type doped region 208. Thus, when the device is under a withstand voltage in an OFF-state, a reverse depletion layer is formed by the N-P structures of the drift region 205—the second conductive type doped region 208 and the channel area 206 the second conductive type doped region 208. At this time, since the trench gate is at a zero potential, and the second conductive type doped region 208 is still at a low potential, the second conductive type doped region 208 is involved in the whole depletion withstand voltage process, and the trench gate is not involved in, thereby effectively avoiding the weak point of the sharp corner at the bottom of the trench, and improving the stability of the withstand voltage.

In one embodiment, the first conductive type doped region 207 has a higher doping concentration than the drift region 205, and the drain region 209 has a higher doping concentration than the first conductive type doped region 207.

Generally speaking, a drift region 205 has a lower doping concentration, which corresponds to a high resistance region being formed between the source and drain. As such, the breakdown voltage can be increased, the parasitic capacitance between the source and drain can be reduced, and the frequency characteristics of the device can be advantageously improved.

For a conventional trench gate depletion mode VDMOS transistor, the carrier concentration of the N+ type doped drain region at the bottom of it is quite different from that of the N− type drift region. The thermal process during the formation of the P type well will lead to a large amount of N+ to be reversely diffused into the drift region and the effective drift region to be greatly reduced in thickness. As a result, increasing a margin of a N-type epitaxial (i.e., the N-type epitaxial serves as a N-type drift region) as required in a design corresponds to increasing an on-resistance. For the trench gate depletion mode VDMOS transistor shown in FIG. 1, there is a N type well (i.e., a first conductive type doped region 207) present under the drift region 205, which corresponds to a carrier concentration buffer region being formed between the drain region 209 (N+) and the drift region 205 (N−). As such, the concentration of the drift region 205 became more stable (less N type impurities are diffused into the drift region 205 from below), the reverse withstand voltage can be better utilized, and there is no need to reserve a lager margin for the drift region 205. As a result, the drift region 205 with a higher resistance can be made thinner, and the on-resistance can be reduced.

In an embodiment, the gate insulating layer 204 may include a conventional dielectric material such as silicon oxide, silicon nitride, and silicon oxynitride having a dielectric constant from about 4 to about 20 (measured in vacuum). Alternatively, the gate insulating layer 204 may include a generally higher dielectric constant dielectric material having a dielectric constant from about 20 to at least about 100. Such a higher dielectric constant dielectric material can include but is not limited to hafnium oxide, hafnium silicate, titanium oxide, barium strontium titanate (BSTs) and lead zirconate titanate (PZTs).

In an embodiment, the gate electrode 201 is a polysilicon material, and in other embodiments, metal, metal nitride, metal silicide, or a similar compound may also be used as a material of the gate electrode 201.

Figure 2:
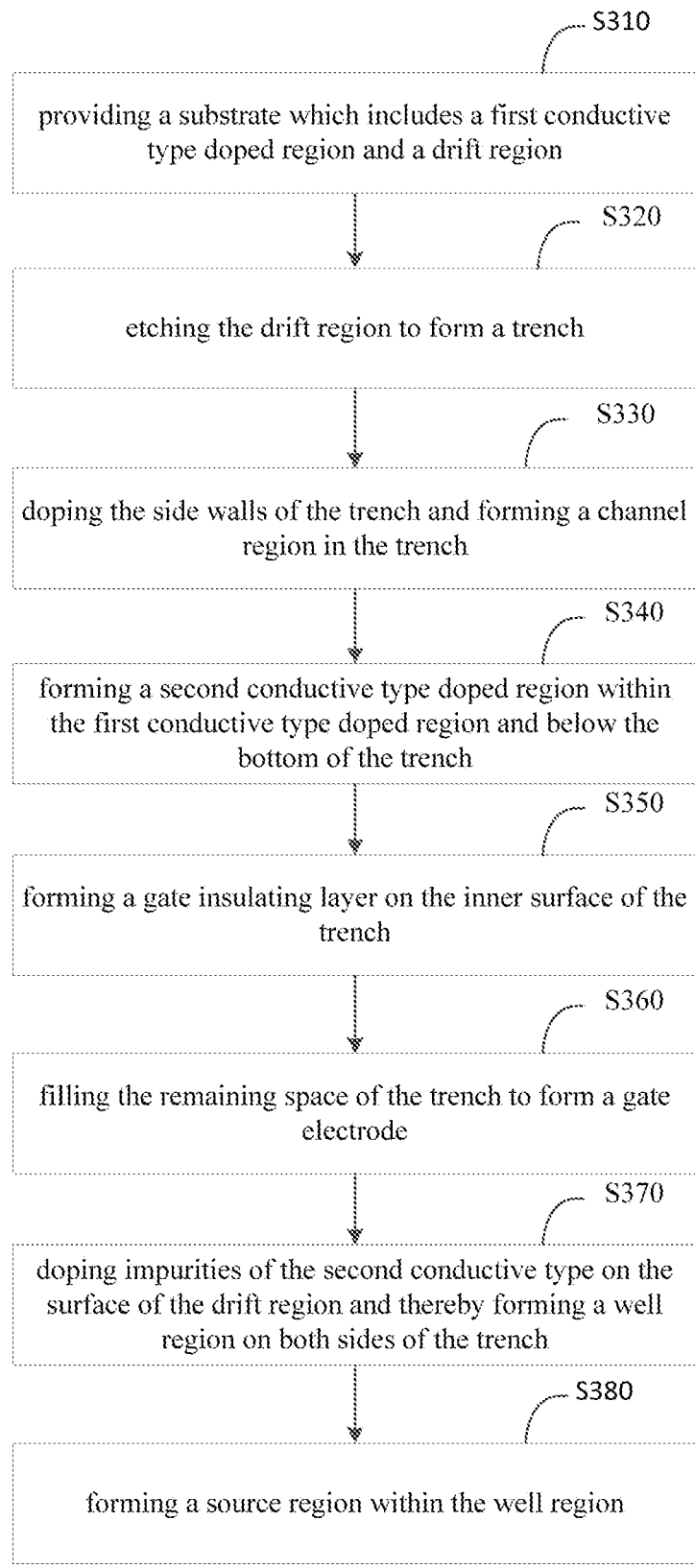
FIG. 2 is a flowchart of a method for manufacturing a trench gate depletion mode VDMOS device in an embodiment.

A method for manufacturing a trench gate depletion mode VDMOS device is also provided in this invention. FIG. 2 is a flow chart of a method for manufacturing a trench gate depletion mode VDMOS device in an embodiment. The method includes the following steps:

At S310, a substrate is provided.

Figure 3A:
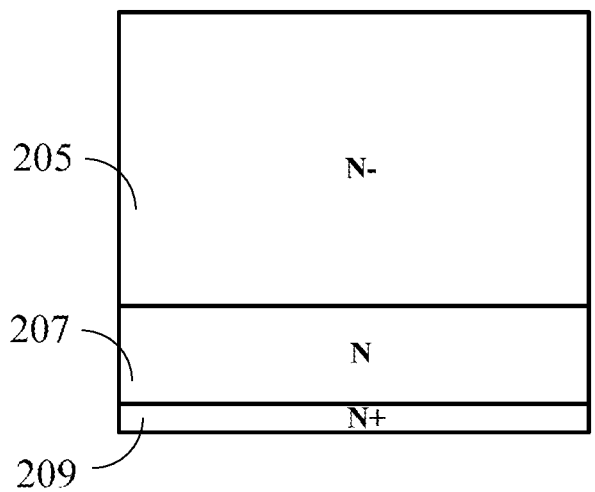
FIG. 3a-FIG. 3d are cross-sectional diagrams of a trench gate depletion mode VDMOS device manufactured by the method shown in FIG. 2 during the manufacturing process.

The substrate includes a first conductive type doped region 207 and a drift region 205. In the embodiment shown in FIG. 3a, firstly the first conductive type doped region 207 of N type is epitaxially formed on the substrate of N+ type (which is used as a drain region 209), and then the drift region 205 of N− type is epitaxially formed on the first conductive type doped region 207. The drain region 209 has a higher doping concentration than the first conductive type doped region 207, and the first conductive type doped region 207 has a higher doping concentration than the drift region 205. In other embodiments, the step of forming the drain region 209 can also be happened in a subsequent step and is carried out by a process familiar to those skilled in the art (e.g., ion injection). For an embodiment in which the drain region 209 is formed in a subsequent step, at step S310, the drift region 205 may be epitaxially formed on the first conductive type doped region 207, or the first conductive type doped region 207 may be epitaxially formed on the drift region 205.

S320, the drift area is etched to form a trench.

In the specification of the disclosure, an upward side of each object in the drawings is referred to as a front side, and a downward side is referred to as a back side. The front side of the drift region 205 is etched (after photoetching) to form a trench 301. The bottom of the trench 301 should be deep enough to reach the first conductive type doped region 207, and in some embodiments, a part of the first conductive type doped region 207 can be etched downward.

At S330, the side walls of the trench are doped and a channel region is formed in the trench.

Figure 3B:
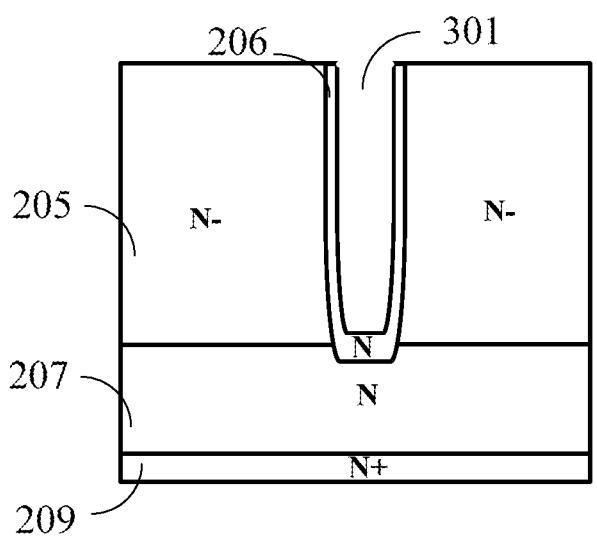
Figure 3C:
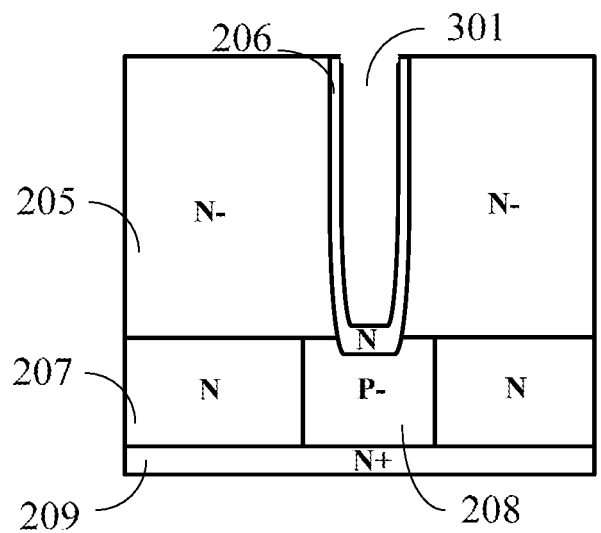

Referring to FIG. 3b, in this embodiment, a channel region 206 is formed by implanting N type ions, thus the channel region serves as a N type conductive channel.

At S340, a second conductive type doped region is formed within the first conductive type doped region and below the bottom of the trench.

Impurities of the second conductive type are doped into an area of the first conductive type doped region 207 around the bottom of the trench 301, and thereby a second conductive type doped region 208 is formed within the first conductive type doped region 207. In this embodiment, impurities of P type are implanted into the bottom of trench 301, and a P− type well is formed after a driven-in process.

In an embodiment, the ion implantations performed at step S330 and step S340 are implantations carried out under the masking of the photoresist remaining after step S320. As a result, no additional photo-etching layers should be added at step S330 and step S340.

At S350, a gate insulating layer is formed on the inner wall of the trench.

In an embodiment, the gate insulating layer 204 may include a conventional dielectric material such as silicon oxide, silicon nitride, and silicon oxynitride having a dielectric constant from about 4 to about 20 (measured in vacuum). Alternatively, the gate insulating layer 204 may include a generally higher dielectric constant dielectric material having a dielectric constant from about 20 to at least about 100. Such a higher dielectric constant dielectric material can include but is not limited to hafnium oxide, hafnium silicate, titanium oxide, barium strontium titanate (BSTs) and lead zirconate titanate (PZTs). The gate insulating layer can be formed by a deposition process, a thermal oxidation process or any other process known in the art dependent on the material being selected.

At S360, the remaining space of the trench is filled to form a gate electrode.

Figure 3D:
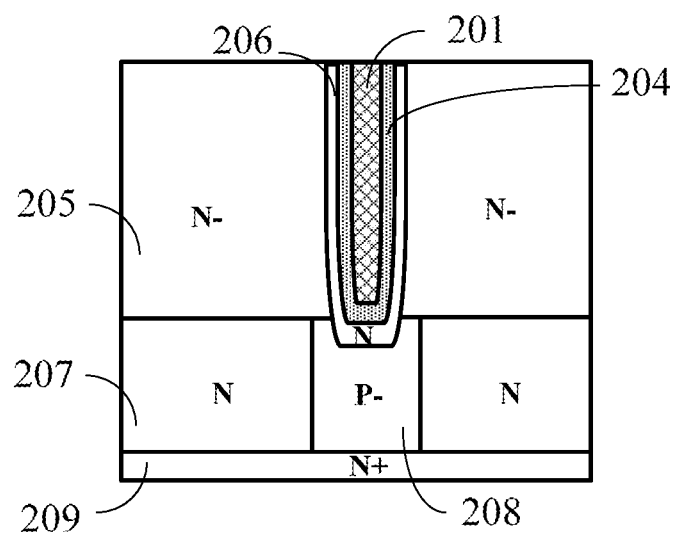

In an embodiment, the gate electrode 201 is a polysilicon material, and in other embodiments, metal, metal nitride, metal silicide, or similar compound may also be used as a material of the gate electrode 201. In this embodiment, the gate electrode 201 is formed by filling polysilicon into the trench 301 using a deposition process, as shown in FIG. 3d.

At S370, second conductive type impurities of the second conductive type are doped on the surface of the drift region, and thereby a well region is formed on both sides of the trench.

In the present embodiment, a high-pressure P well is formed as the well region 202 by performing a driven-in process after implanting P type ions.

At S380, a source region is formed within the well region.

The source region 203 is formed by doping impurities of first conductive type into the well region 202. In the embodiment shown in FIG. 1, a body lead-out region of P+ is also formed in the well region 202. In some embodiments, the source region 203 can be formed by implantation firstly, and then the body lead-out region is formed by implantation. In other embodiments, the body lead-out region can be formed by implantation firstly, and then the source region 203 is formed by implantation.

After step S380 has been finished, metallization is carried out during a back-end-of-line process (please note that if the drain region 209 is not formed at step S310, then the drain region 209 should be formed before the metallization), such that metal electrode lead-outs of source terminal, drain terminal and gate terminal are formed.

Compared with the conventional technology, in the above method for manufacturing a trench gate depletion mode VDMOS device, only one more layer of N type epitaxy (served as a epitaxy of the first conductive type doped region 207) is required. Further, the multiple of epitaxial processes in the traditional super junction process are not needed any more. As such, such a method is easy to realize in process manufacturing.

Although the embodiments described above merely illustrate several implements of this invention and the descriptions to these implements are specific and detailed, they should not be construed to limit the scope of this invention. It should be noted that, for those skilled in the art, several variations and modifications may be made without departing from the spirit of this invention, all of which shall be regarded as within the scope of this invention. Therefore, the protection scope of the present invention shall be subject to the protection scope defined by the claims.

What is claimed is:

1. A trench gate depletion mode VDMOS device comprising:
    a drain region being of a first conductive type;
    a trench gate including a gate insulating layer on an inner wall of a trench and a gate electrode filled in the trench and surrounded by the gate insulating layer;
    a channel region located around the gate insulating layer and being of the first conductive type;

a well region located on both sides of the trench gate and being of a second conductive type, wherein the first conductive type is a conductive type opposite to the second conductive type;

a source region located within the well region and being of the first conductive type;

a drift region located between the well region and the drain region, the drift region being of the first conductive type;

a second conductive type doped region located between the channel region and the drain region;

a first conductive type doped region located on both sides of the second conductive type doped region and located between the drift region and the drain region.

2. The trench gate depletion mode VDMOS device according to claim 1, wherein first conductive type doped region has a higher doping concentration than the drift region.

3. The trench gate depletion mode VDMOS device according to claim 2, wherein the drain region has a higher doping concentration than the first conductive type doped region.

4. The trench gate depletion mode VDMOS device according to claim 1, wherein a bottom of the channel region extends into the second conductive type doped region.

5. The trench gate depletion mode VDMOS device according to claim 1, wherein the second conductive type doped region has a lower doping concentration than the well region.

6. The trench gate depletion mode VDMOS device according to claim 1, wherein the device further includes a body lead-out region of the second conductive type which is located in the well region.

7. The trench gate depletion mode VDMOS device according to claim 1, wherein the material of the gate insulating layer is silicon oxide, and the material of the gate electrode is polysilicon.

8. The trench gate depletion mode VDMOS device according to claim 1, wherein the first conductive type is N type and the second conductive type is P type.

9. The trench gate depletion mode VDMOS device according to claim 1, wherein both the first conductive type doped region and the second conductive type doped region are super junction structures.

10. A method for manufacturing a trench gate depletion mode VDMOS device comprising:

providing a substrate which includes a first conductive type doped region and a drift region of a first conductive type on the first conductive type doped region;

etching the drift region to form a trench;

doping side walls of the trench to form a channel region in the trench;

doping impurities of a second conductive type into an area of the first conductive type doped region around a bottom of the trench, and thereby forming a second conductive type doped region within the first conductive type doped region; the first conductive type being a conductive type opposite to the second conductive type;

forming a gate insulating layer on an inner wall of the trench;

filling a remaining space of the trench to form a gate electrode;

doping impurities of the second conductive type on the surface of the drift region to form a well region at both sides of the trench;

doping impurities of the first conductive type into the well region, and thereby forming a source region.

11. The method according to claim 10, wherein in providing the substrate, the first conductive type doped region is formed by an epitaxy process.

12. The method according to claim 10, wherein providing the substrate includes epitaxilly forming the drift region on the first conductive type doped region.

13. The method according to claim 10, wherein in etching the drift region to form the trench, the bottom of the trench reaches the first conductive type doped region.

14. The method according to claim 10, wherein etching the drift region to form the trench is to etch after photoetching, and the remaining photoresist is used as a masking layer for doping the side walls of the trench and doping impurities of the second conductive type into the area of the first conductive type doped region around the bottom of the trench.

15. The method according to claim 10, wherein in providing a substrate, the substrate is of the first conductive type and is used as a drain region, the drain region has a higher doping concentration than the first conductive type doped region, and the first conductive type doped region has a higher doping concentration than the drift region.

* * * * *